(12) United States Patent
Cerafogli et al.

(10) Patent No.: US 12,099,748 B2
(45) Date of Patent: *Sep. 24, 2024

(54) NAND TEMPERATURE-AWARE OPERATIONS

(71) Applicant: Micron Technology, Inc., Boise, ID (US)

(72) Inventors: Chiara Cerafogli, Boise, ID (US); Fulvio Rori, Boise, ID (US); Jonathan W Oh, Boise, ID (US); Giuseppe Cariello, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/373,301

(22) Filed: Jul. 12, 2021

(65) Prior Publication Data

US 2021/0342100 A1    Nov. 4, 2021

Related U.S. Application Data

(63) Continuation of application No. 16/023,130, filed on Jun. 29, 2018, now Pat. No. 11,061,606.

(51) Int. Cl.
  *G06F 3/06* (2006.01)
  *G06F 11/10* (2006.01)
  (Continued)

(52) U.S. Cl.
  CPC .......... *G06F 3/0659* (2013.01); *G06F 3/0604* (2013.01); *G06F 3/0653* (2013.01);
  (Continued)

(58) Field of Classification Search
  CPC .... G06F 3/0659; G06F 3/0604; G06F 3/0653; G06F 3/0679; G06F 11/1068;
  (Continued)

(56) References Cited

U.S. PATENT DOCUMENTS 10,026,483 B1 *  7/2018  Shah ...................... G11C 16/08
11,061,606 B2    7/2021  Cerafogli et al.
(Continued)

FOREIGN PATENT DOCUMENTS

CN    102543154       7/2012
CN    112424865 A     2/2021
(Continued)

OTHER PUBLICATIONS

"International Application Serial No. PCT/US2019/039210, International Preliminary Report on Patentability mailed Jan. 7, 2021", 9 pgs.
(Continued)

*Primary Examiner* — Michelle T Bechtold
*Assistant Examiner* — Tong B. Vo
(74) *Attorney, Agent, or Firm* — Schwegman Lundberg & Woessner, P.A.

(57) ABSTRACT

Devices and techniques for NAND temperature-aware operations are disclosed herein. A device controller can receive a command to write data to a component in the device. A temperature corresponding to the component can be obtained in response to receiving the command. The command can be executed by the controller to write data to the component. Executing the command can include writing the temperature into a management portion of the device that is separate from a user portion of the device to which the data is written.

24 Claims, 11 Drawing Sheets

(51) Int. Cl.
  *G11C 16/04* (2006.01)
  *G11C 16/10* (2006.01)
  *G11C 16/26* (2006.01)
  *G11C 29/52* (2006.01)

(52) U.S. Cl.
  CPC ........ *G06F 3/0679* (2013.01); *G06F 11/1068* (2013.01); *G11C 16/0483* (2013.01); *G11C 16/10* (2013.01); *G11C 16/26* (2013.01); *G11C 29/52* (2013.01)

(58) Field of Classification Search
  CPC ... G06F 3/0616; G11C 16/0483; G11C 16/10; G11C 16/26; G11C 29/52; G11C 29/44; G11C 2211/5641; G11C 2211/5646; G11C 7/04; G11C 11/5628; G11C 16/28; G11C 16/3418; G11C 29/028; G11C 29/021; G11C 16/22
  See application file for complete search history.

(56) References Cited

U.S. PATENT DOCUMENTS

| | | |
|---|---|---|
| 2012/0287711 A1 | 11/2012 | Kim et al. |
| 2013/0070531 A1 | 3/2013 | Zhao et al. |
| 2013/0227268 A1 | 8/2013 | Ichida et al. |
| 2014/0082259 A1* | 3/2014 | Yeh ............... G06F 12/0246 711/103 |
| 2014/0157078 A1* | 6/2014 | Danilak ........... G06F 11/1048 714/773 |
| 2015/0301932 A1* | 10/2015 | Oh ..................... G06F 13/00 711/102 |
| 2016/0041759 A1 | 2/2016 | Han |
| 2016/0117216 A1* | 4/2016 | Muchherla ........... G06F 11/30 714/6.11 |
| 2016/0170642 A1* | 6/2016 | Miyamoto ........... G06F 3/0655 711/103 |
| 2016/0274803 A1 | 9/2016 | Earhart |
| 2016/0322108 A1* | 11/2016 | Yang ................. G11C 16/10 |
| 2017/0285944 A1 | 10/2017 | Wang |
| 2018/0276072 A1 | 9/2018 | Kodama et al. |
| 2018/0277173 A1* | 9/2018 | Takizawa ........... G11C 16/3459 |
| 2018/0293029 A1* | 10/2018 | Achtenberg ........ G11C 29/028 |
| 2019/0035474 A1 | 1/2019 | Tassan et al. |
| 2019/0043596 A1* | 2/2019 | Madraswala ......... G11C 16/26 |
| 2019/0171520 A1* | 6/2019 | Cadigan ............. G06F 11/1004 |
| 2019/0332321 A1* | 10/2019 | Chen .................. G06F 13/1668 |
| 2020/0004458 A1 | 1/2020 | Cerafogli et al. |

FOREIGN PATENT DOCUMENTS

| | | |
|---|---|---|
| KR | 20160038642 A | 4/2016 |
| WO | WO-2020006060 A1 | 1/2020 |

OTHER PUBLICATIONS

"International Application Serial No. PCT/US2019/039210, International Search Report mailed Oct. 18, 2019", 3 pgs.

"International Application Serial No. PCT/US2019/039210, Written Opinion mailed Oct. 18, 2019", 7 pgs.

"Korean Application Serial No. 10-2021-7001085, Notice of Preliminary Rejection mailed Jan. 28, 2022", w English translation, 11 pgs.

"Korean Application Serial No. 10-2021-7001085, Notice of Preliminary Rejection mailed Jan. 28, 2022", with English claims, 24 pages.

"Chinese Application Serial No. 201980046923.1, Office Action mailed Aug. 4, 2023", with English translation, 12 pages.

* cited by examiner

NAND TEMPERATURE-AWARE OPERATIONS

PRIORITY APPLICATION

This application is a continuation of U.S. application Ser. No. 16/023,130, filed Jun. 29, 2018, which is incorporated herein by reference in its entirety.

BACKGROUND

Memory devices are typically provided as internal, semiconductor, integrated circuits in computers or other electronic devices. There are many different types of memory, including volatile and non-volatile memory.

Volatile memory requires power to maintain its data, and includes random-access memory (RAM), dynamic random-access memory (DRAM), or synchronous dynamic random-access memory (SDRAM), among others.

Non-volatile memory can retain stored data when not powered, and includes flash memory, read-only memory (ROM), electrically erasable programmable ROM (EEPROM), static RAM (SRAM), erasable programmable ROM (EPROM), resistance variable memory, such as phase-change random-access memory (PCRAM), resistive random-access memory (RRAM), magnetoresistive random-access memory (MRAM), or 3D XPoint™ memory, among others.

Flash memory is utilized as non-volatile memory for a wide range of electronic applications. Flash memory devices typically include one or more groups of one-transistor, floating gate or charge trap memory cells that allow for high memory densities, high reliability, and low power consumption.

Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a bit line.

Both NOR and NAND architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner that is unrestricted by their stored data values). Current then flows from the source line to the bit line through each series coupled group, restricted only by the selected memory cells of each group, placing current encoded data values of selected memory cells on the bit lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data.

However, flash memory cells can also represent one of more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein it is broader context, to can refer to any memory cell that can store more than one bit of data per cell (i.e., that can represent more than two programmed states).

Traditional memory arrays are two-dimensional (2D) structures arranged on a surface of a semiconductor substrate. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures, such as 3D NAND architecture semiconductor memory devices, are being developed to further increase memory density and lower memory cost.

Such 3D NAND devices often include strings of storage cells, coupled in series (e.g., drain to source), between one or more source-side select gates (SGSs) proximate a source, and one or more drain-side select gates (SGDs) proximate a bit line. In an example, the SGSs or the SGDs can include one or more field-effect transistors (FETs) or metal-oxide semiconductor (MOS) structure devices, etc. In some examples, the strings will extend vertically, through multiple vertically spaced tiers containing respective word lines. A semiconductor structure (e.g., a polysilicon structure) can extend adjacent a string of storage cells to form a channel for the storages cells of the string. In the example of a vertical string, the polysilicon structure can be in the form of a vertically extending pillar. In some examples the string can be "folded," and thus arranged relative to a U-shaped pillar. In other examples, multiple vertical structures can be stacked upon one another to form stacked arrays of storage cell strings.

Memory arrays or devices can be combined together to form a storage volume of a memory system, such as a solid-state drive (SSD), a Universal Flash Storage (UFS™) device, a MultiMediaCard (MMC) solid-state storage device, an embedded MMC device (eMMC™), etc. An SSD can be used as, among other things, the main storage device of a computer, having advantages over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.). SSDs use non-volatile memory cells, such as flash memory cells to obviate internal battery supply requirements, thus allowing the drive to be more versatile and compact.

An SSD can include a number of memory devices, including a number of dies or logical units (e.g., logical unit numbers or LUNs), and can include one or more processors or other controllers performing logic functions required to operate the memory devices or interface with external systems. Such SSDs can include one or more flash memory die, including a number of memory arrays and peripheral circuitry thereon. The flash memory arrays can include a number of blocks of memory cells organized into a number of physical pages. In many examples, the SSDs will also include DRAM or SRAM (or other forms of memory die or other memory structures). The SSD can receive commands from a host in association with memory operations, such as read or write operations to transfer data (e.g., user data and associated integrity data, such as error data and address data, etc.) between the memory devices and the host, or erase operations to erase data from the memory devices.

BRIEF DESCRIPTION OF THE DRAWINGS

In the drawings, which are not necessarily drawn to scale, like numerals can describe similar components in different views. Like numerals having different letter suffixes can represent different instances of similar components. The drawings illustrate generally, by way of example, but not by way of limitation, various embodiments discussed in the present document.

DETAILED DESCRIPTION

Figure 1:
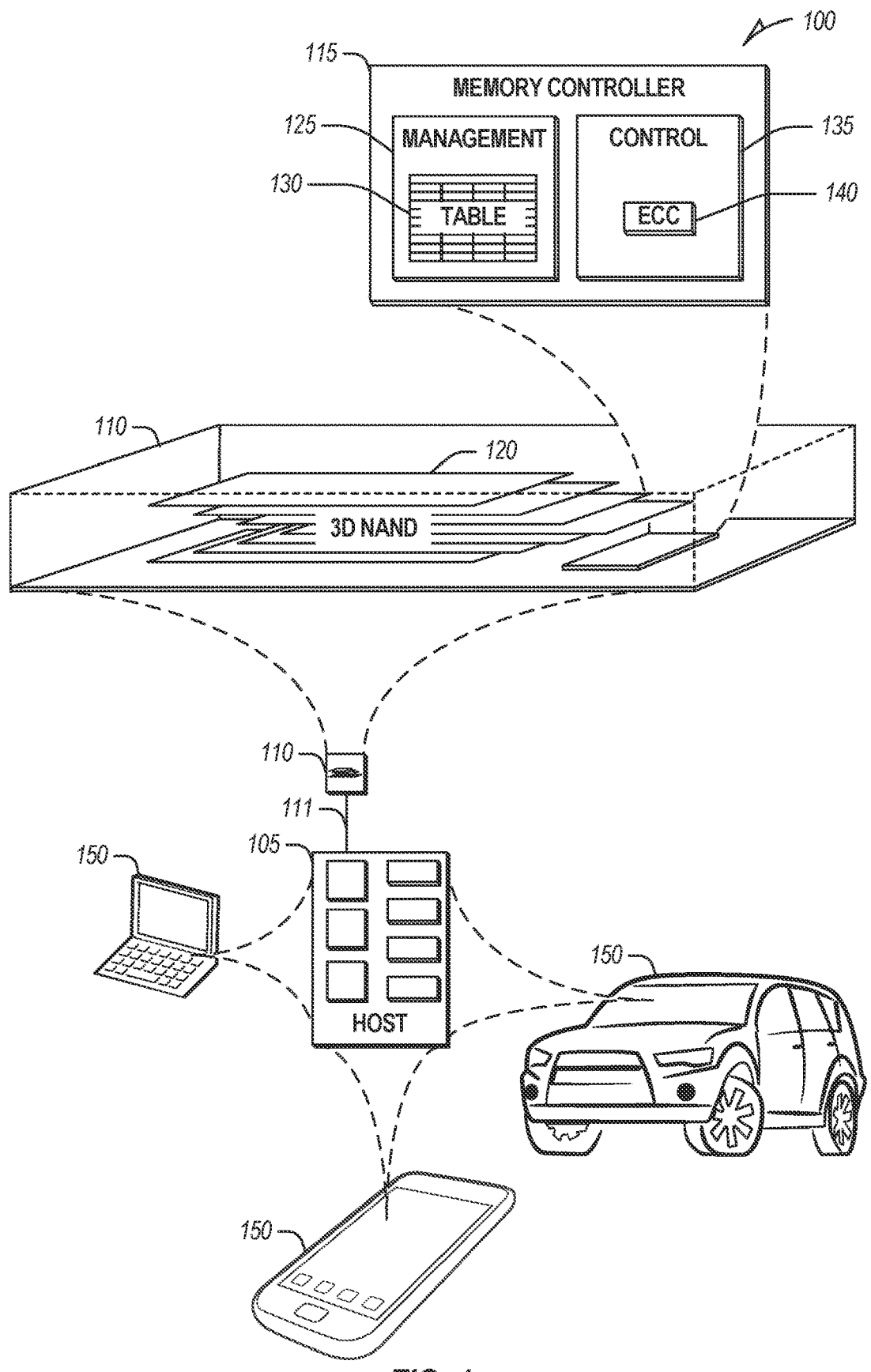
FIG. 1 illustrates an example of an environment including a memory device.

Flash devices work by trapping a charge in a cell (e.g., in a charge trap or floating gate) that then interferes with opening a channel by a control gate. The control gate read voltage is calibrated to be between two trapped charge states. Thus, if the channel opens (e.g., the control gate voltage can override the trapped charge) the cell has one value (e.g., a '1' in a single level cell (SLC)) and a different value if the channel does not open (e.g., a '0' in an SLC). Thus, it is important that the trapped charge is calibrated with the read voltage. If the calibration is incorrect, the value of the cell can be misread, prompting error recovery techniques that can increase latency in NAND operations. These issues can be particularly important in a variety of applications, including embedded (e.g., automobile) and mobile device (e.g., mobile phone, tablet, etc.) applications.

The calibration of the trapped charge and read voltage can be affected by several circumstances. For example, the trapped charge can dissipate over time. This condition can be detected and remedied via a cell refresh. Refreshes help to preserve data integrity at the cost of wear on the cells themselves. Thus, at a system level, flash blocks are refreshed whenever cell voltage margins diminish on a block. The margins could deteriorate due to various combinations of charge gain and charge loss. However, too much refresh activity results in waste of both cell program and erase cycles and processing (e.g., leads to a performance impact for the flash device as resources are used to perform the refresh).

Another issue with the calibration of the trapped charge and the read voltage is temperature. Generally, the threshold voltage of a flash transistor changes with temperatures. A NAND controller typically compensates the read voltage based on the ambient temperature. However, the adjustment is generally coarse, with a global read trim (e.g., adjustment) applied to several million transistors in the NAND package where there can be transistor-to-transistor differences with respect to the threshold voltage movement for temperature. Thus, programming at one temperature and reading at a different temperature tends to exacerbate margins, but the margin loss is temporary (e.g., it is curable by either adjusting the read voltage or by waiting until the read temperature is similar to the write temperature).

To solve these issues—e.g., to minimize unnecessary refreshes due to cross-temperature related high fail bit count scenarios—the write temperature is stored along with the data that was written. In unmanaged flash devices, a host would typically monitor the flash temperatures constantly and include the write temperature in a user data area accessible to the host. Although the write temperature is now stored with the data, this again raises several issues. For example, there is significant signaling overhead in polling the flash components for their temperatures and then re-writing those temperatures back to the flash device. In these cases, the host (e.g., firmware) has to track the temperature in real-time, resulting in addition resource use (e.g., hit on the memory controller of the host).

To address these problems, a NAND controller to implement temperature-aware NAND operations is described herein. The NAND controller writes the temperature information to flag bytes of the flash devices, such as flash cells in a page reserved for controller data (e.g., error correction or other metadata). Because the controller is managing the temperature measurement and writing, the host is not burdened with the temperature reading and writing overhead.

The NAND controller can use the stored temperature to correct read voltages (e.g., trims) to avoid errors in the first place, as well as tailor recovery procedures (e.g., selecting from a set of temperature dependent error correction) to be faster or more effective. In an example, because pages are generally the smallest addressable portion of a flash array, the controller can read each page upon startup, perform error correction to recover the temperature information, and cache the temperature of each block to either correct read voltages or provide the temperature to a host to then correct read voltages. However, because page flag bytes are generally stored as SLC, with read margins sufficient to compensate for a wide range of cross-temperature variance between the program and read, no error recovery is needed to read the temperature in many situations. Moreover, flag bytes often include more robust error handling (e.g., a greater number of parity bits), further reducing the likelihood that error recovery is necessary even given a great cross-temperature condition. This decoupling of the temperature data from the data code words provides a more reliable technique.

In addition to storing the temperature in the flag bytes, excess space in error recovery codes (ECCs) can be used. For example, low-density parity-check (LDPC) codes used for error detection or recovery can have as many as thirty-two unused bits in many NAND device configurations. These bits can be repurposed to hold the write temperature, being written when the ECC is calculated on a write and read when error detection is performed on a read. In an example, this ECC space temperature storage can be used in addition to the flag byte storage described above.

The NAND controller can also use the stored temperature, now accessible to the NAND controller, to manage maintenance procedures. For example, the controller can compare the stored temperature with a current temperature to determine if a write error is due to a bad component (e.g., when the temperatures are within a threshold of each other) or due to a cross-temperature effect (e.g., the write temperature was beyond a threshold higher than a current temperature). If the latter case, the controller can refrain from refreshing the block, marking the block bad (e.g., retire the block), etc.

The advantages presented by the techniques herein are numerous. For example, traditional temperature storage in the meta data at system level is not very reliable because cross temperature issues affect the entire code word. In these cases, systems cannot reliably read back the previously stored temperature information because the temperature information is part of the failing data. In contrast, storing the temperature information in the flag bytes decouples the temperature information from the code word, provides a more reliable way to store the temperature information. Flag bytes are more reliable because they are generally written with solid L5 pattern. Better read margins can be achieved due to using the Lower Page (LP) read level, although Upper Page (UP) and Extra Page (XP) read levels are also effective. Further, because the NAND device itself can use the temperature information to avoid errors in the first place and implement temperature tailored error recovery, the interaction between the NAND device and the host is reduced, resulting in more efficient host interactions. Additional details and examples are described below.

FIG. 1 illustrates an example of an environment 100 including a host device 105 and a memory device 110 configured to communicate over a communication interface. The host device 105 or the memory device 110 can be included in a variety of products 150 such as Internet of Things (IoT) devices (e.g., a refrigerator or other appliance, sensor, motor or actuator, mobile communication device, automobile, drone, etc.) to support processing, communications, or control of the product 150.

The memory device 110 includes a memory controller 115 and a memory array 120 including, for example, a number of individual memory die (e.g., a stack of three-dimensional (3D) NAND die). In 3D architecture semiconductor memory technology, vertical structures are stacked, increasing the number of tiers, physical pages, and accordingly, the density of a memory device (e.g., a storage device). In an example, the memory device 110 can be a discrete memory or storage device component of the host device 105. In other examples, the memory device 110 can be a portion of an integrated circuit (e.g., system on a chip (SOC), etc.), stacked or otherwise included with one or more other components of the host device 105. In these examples, the memory device 110 communicates with host device 105 components via an interlink 111, such as a bus. Thus, as described herein, a host, or host device 105 operation is distinct from those of the memory device 110, even when the memory device 110 is integrated into the host device 105.

One or more communication interfaces (e.g., the interlink 111) can be used to transfer data between the memory device 110 and one or more other components of the host device 105, such as a Serial Advanced Technology Attachment (SATA) interface, a Peripheral Component Interconnect Express (PCIe) interface, a Universal Serial Bus (USB) interface, a Universal Flash Storage (UFS) interface, an eMMC™ interface, or one or more other connectors or interfaces. The host device 105 can include a host system, an electronic device, a processor, a memory card reader, or one or more other electronic devices external to the memory device 110. In some examples, the host 105 can be a machine having some portion, or all, of the components discussed in reference to the machine 1100 of FIG. 11.

The memory controller 115 can receive instructions from the host 105, and can communicate with the memory array, such as to transfer data to (e.g., write or erase) or from (e.g., read) one or more of the memory cells, planes, sub-blocks, blocks, or pages of the memory array. The memory controller 115 can include, among other things, circuitry or firmware, including one or more components or integrated circuits. For example, the memory controller 115 can include one or more memory control units, circuits, or components configured to control access across the memory array 120 and to provide a translation layer between the host 105 and the memory device 110. The memory controller 115 can include one or more input/output (I/O) circuits, lines, or interfaces to transfer data to or from the memory array 120. The memory controller 115 can include a memory manager 125 and an array controller 135.

The memory manager 125 can include, among other things, circuitry or firmware, such as a number of components or integrated circuits associated with various memory management functions. For purposes of the present description example memory operation and management functions will be described in the context of NAND memory. Persons skilled in the art will recognize that other forms of non-volatile memory can have analogous memory operations or management functions. Such NAND management functions include wear leveling (e.g., garbage collection or reclamation), error detection or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more component of the memory device 110 (e.g., various information associated with a memory array or one or more memory cells coupled to the memory controller 115). For example, the management tables 130 can include information regarding block age, block erase count, error history, or one or more error counts (e.g., a write operation error count, a read bit error count, a read operation error count, an erase error count, etc.) for one or more blocks of memory cells coupled to the memory controller 115. In certain examples, if the number of detected errors for one or more of the error counts is above a threshold, the bit error can be referred to as an uncorrectable bit error. The management tables 130 can maintain a count of correctable or uncorrectable bit errors, among other things.

The array controller 135 can include, among other things, circuitry or components configured to control memory operations associated with writing data to, reading data from, or erasing one or more memory cells of the memory device 110 coupled to the memory controller 115. The memory operations can be based on, for example, host commands received from the host 105, or internally generated by the memory manager 125 (e.g., in association with wear leveling, error detection or correction, etc.).

The array controller 135 can include an error correction code (ECC) component 140, which can include, among other things, an ECC engine or other circuitry configured to detect or correct errors associated with writing data to or reading data from one or more memory cells of the memory device 110 coupled to the memory controller 115. The memory controller 115 can be configured to actively detect and recover from error occurrences (e.g., bit errors, operation errors, etc.) associated with various operations or storage of data, while maintaining integrity of the data transferred between the host 105 and the memory device 110, or maintaining integrity of stored data (e.g., using redundant RAID storage, etc.), and can remove (e.g., retire) failing memory resources (e.g., memory cells, memory arrays, pages, blocks, etc.) to prevent future errors. The memory array 120 can include several memory cells arranged in, for example, a number of devices, planes, sub-blocks, blocks, or pages. As one example, a 48 GB TLC NAND memory device can include 18,592 bytes (B) of data per page (16,684+5208 bytes), 1536 pages per block, 548 blocks per plane, and 4 or more planes per device. As another example, a 32 GB MLC memory device (storing two hits of data per cell (i.e., 4 programmable states)) can include 18,592 bytes (B) of data per page (16,684+5208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, can be selectively operated in SLC mode, or in a desired MLC mode (such as TLC, QLC, etc.).

In operation, data is typically written to or read from the NAND memory device 110 in pages, and erased in blocks. However, one or more memory operations (e.g., read, write, erase, etc.) can be performed on larger or smaller groups of memory cells, as desired. The data transfer size of a NAND memory device 110 is typically referred to as a page, whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB can include 4 KB of user data (e.g., 8 sectors assuming a sector size of 512 B) as well as a number of bytes (e.g., 32 B, 54 B, 524 B, etc.) of metadata corresponding to the user data, such as integrity data (e.g., error detecting or correcting code data), address data (e.g., logical address data, etc.), or other metadata associated with the user data.

Different types of memory cells or memory arrays 120 can provide for different page sizes, or can require different amounts of metadata associated therewith. For example, different memory device types can have different bit error rates, which can lead to different amounts of metadata necessary to ensure integrity of the page of data (e.g., a memory device with a higher bit error rate can require more bytes of error correction code data than a memory device with a lower bit error rate). As an example, a multi-level cell (MLC) NAND flash device can have a higher hit error rate than a corresponding single-level cell (SLC) NAND flash device. As such, the MLC device can require more metadata bytes for error data than the corresponding SLC device.

Figure 2:
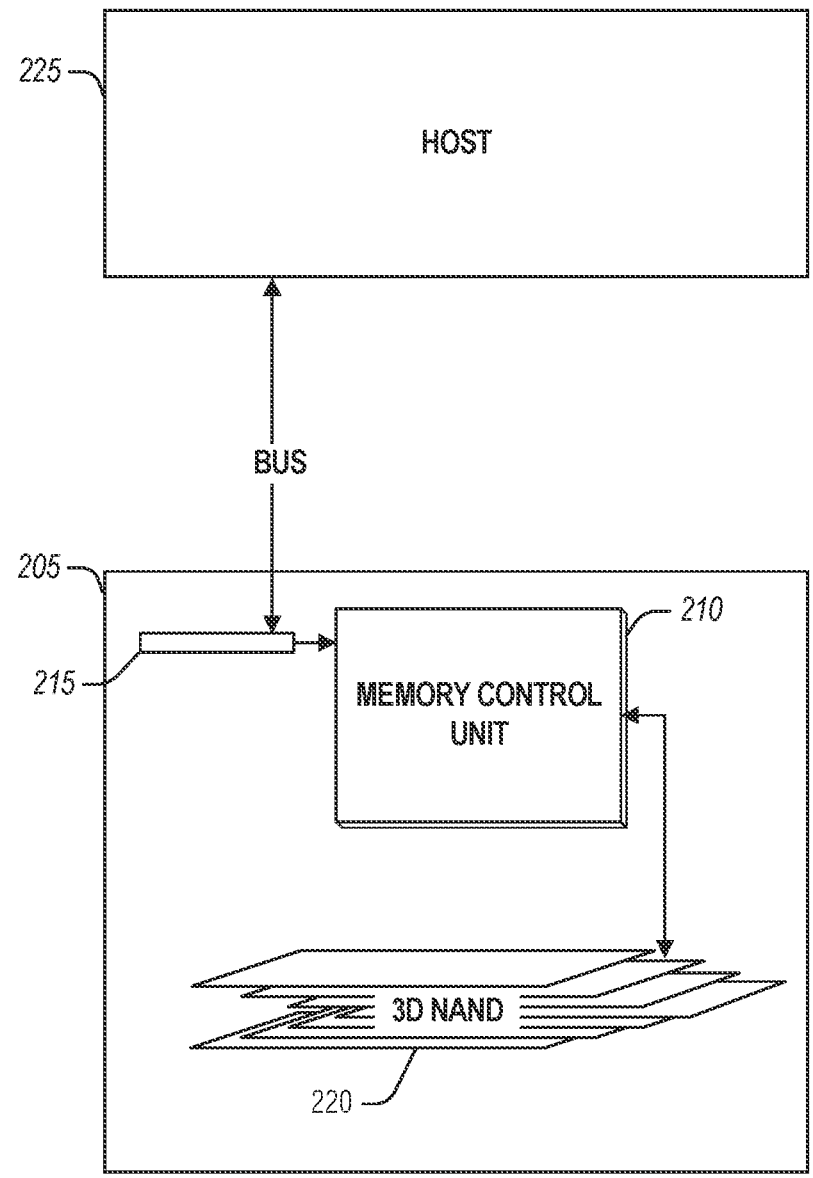
FIG. 2 illustrates an example block diagram of a system for NAND temperature-aware operations.

FIG. 2 illustrates an example block diagram of a system for NAND temperature data management. The illustrated system is a simplified version of that described above with respect to FIG. 1, focusing on components that can be used to implement NAND temperature-aware operations. The system includes a managed memory device 205 (e.g., NAND device, or NAND flash device) connected to a host via an interlink (e.g., bus) when in operation. The managed memory device 205 includes a bus interface 215, a controller 210 (e.g., a memory control unit) and a NAND flash array 220.

To implement temperature-aware NAND operations, the controller 210 is arranged to receive, via the interface 215, a command to write data to a NAND component (e.g., a block, superblock, page, etc.) in the NAND flash array 220 of the NAND device 205. The controller 210 is arranged to obtain a temperature corresponding to the NAND component in response to receiving the command. Thus, the controller 210 can measure the die temperature corresponding to a page when the write is received, ensuring a contemporaneous temperature measurement with the write. In an example, obtaining the temperature includes obtaining the temperature from a thermometer (e.g., embedded in the NAND device 205) in response to receiving the command. In an example, obtaining the temperature includes obtaining the temperature from a buffer. In an example, a thermometer periodically measures the temperature and stores the temperature in the buffer. In these last few examples, the controller 210 does not directly poll the thermometer corresponding to the component, but rather uses a last known good reading provided by the thermometer (or the controller 210 or other component during an idle period, for example).

The controller 210 is arranged to execute the command to write data to the NAND component. In addition, the controller 210 also writes a representation of the temperature contemporaneously with the data write. Here, the data is written to a user portion of the NAND device and the representation of the temperature is written to a management portion. Unlike the user portion, the management portion is accessible only to the controller and thus is segregated from the user portion. In an example, the management portion is on the NAND component. In an example, the NAND component is a page. In an example, the management portion is flag bytes of the page. In an example, the management portion is programmed using a single-level cell (SLC) encoding. In an example, the user portion is programmed using an encoding with a greater density than the SLC encoding, such as MLC or TLC encoding. In an example, the management portion is encoded with error correction (e.g., ECC, Gray codes, etc.).

In an example, the management portion is excess bits in an ECC area. The ECC area is space dedicated by the managed memory device 205 to hold ECC for the data. Often, there are bits in the ECC area that are not used for the ECC. These excess bits can be leveraged to store the temperature. Because the ECC area is not itself protected by ECC, this storage can be more vulnerable to corruption than the flag bytes. However, in an example, the management area can include both the ECC area and the flag bytes, providing a redundant recordation of the temperature with little or no overhead.

In an example, the temperature is written to the management portion on a final programming pass for a multiple-pass programming cycle. Thus, in a two-pass MLC programing, the temperature data is written on the second pass. In an example, the temperature is stored to a resolution of one degree Celsius. In an example, the temperature is stored within a range of negative twenty degrees Celsius to eighty-five degrees Celsius.

In an example, the temperature is stored as a quantization of the temperature at a lower resolution than the obtained temperature. In an example, the quantization is selected from a set of temperature ranges. In an example, the temperature is stored as an identifier of a member of the set of temperature ranges. Thus, in this last example, the controller 210 can have a map of temperature entries, each with a corresponding index. The stored temperature can then be an index corresponding to a map entry (e.g., within a range of temperatures as defined by the map entry). Such an organization can provide for a compact representation of the temperature for complex scenarios. For example, if there is a non-linear correction for temperature ranges (e.g., the cross-temperature problem because worse in a non-linear fashion as write temperatures increase), then entries associated with hotter temperatures can have more narrow ranges while the ranges close to optimal operating temperatures are broad.

The controller 210 is arranged to read the data from the NAND component and is also arranged to read the representation of the temperature when the data is read. In an example, reading the data is in response to a power-on condition of the managed memory device 205. In an example, the representation of the temperature is cached in a volatile memory for future read operations. These examples illustrate a performance improvement that is often used to obtain the read-benefit of storing the temperature with the data. Thus, once read and cached, the temperature can benefit future reads by allowing the read voltage to be calibrated with the cell voltage distributions from the write.

In an example, the temperature is read in response to a read error metric (e.g., bit error rate (BER) or residual BER (RBER)) being over a threshold. This variation can be useful when, for example, there are few cross-temperature accesses for the data and the additional temperature adjustments can often be avoided. In an example, reading the data and the temperature includes the controller 210 the temperature to a second threshold. This second threshold measures whether the cross-temperature condition is significant enough to warrant additional, or specialized, processes. For example, a cross-temperature read-recovery operation can then be performed in response to the temperature being beyond the second threshold. In an example, one of several read recovery operations can be selected based on whether the temperature is above or below the second threshold. An extension of this concept is a series of temperature windows, each with a corresponding read recovery, or other recovery, operation to tailor data recovery based on the specific cross-temperature condition.

Although the description above discusses using the controller 210 to perform recovery operations, in an example, the host 225 can also perform these operations. Thus, the controller 210 can be arranged to provide the stored temperature to the host 225. In an example, the host 225 uses the temperature to implement the cross-temperature read-recovery operation.

In an example, the controller 210 is arranged to modify a maintenance operation on the NAND component based on the temperature stored in the management portion. In an example, the maintenance operation is a refresh of the NAND component. A refresh generally involves copying valid pages from a current block to a subsequent block. Here, modifying the maintenance operation includes adjusting thresholds to perform the refresh based on the temperature. That is, a certain BER can be configured to trigger a refresh. However, if the BER occurs during a significant cross-temperature situation, then the refresh will not be triggered. This is advantageous because it reduces wear on the NAND array 220. In an example, the maintenance operation is a retirement of the NAND component. Here, modifying the maintenance operation includes adjusting thresholds to perform the retirement based on the temperature. Again, retiring a page, or a block, can be avoided by recognizing that a cross-temperature situation can lead to error rates without an underlying problem with the hardware.

Figure 3:
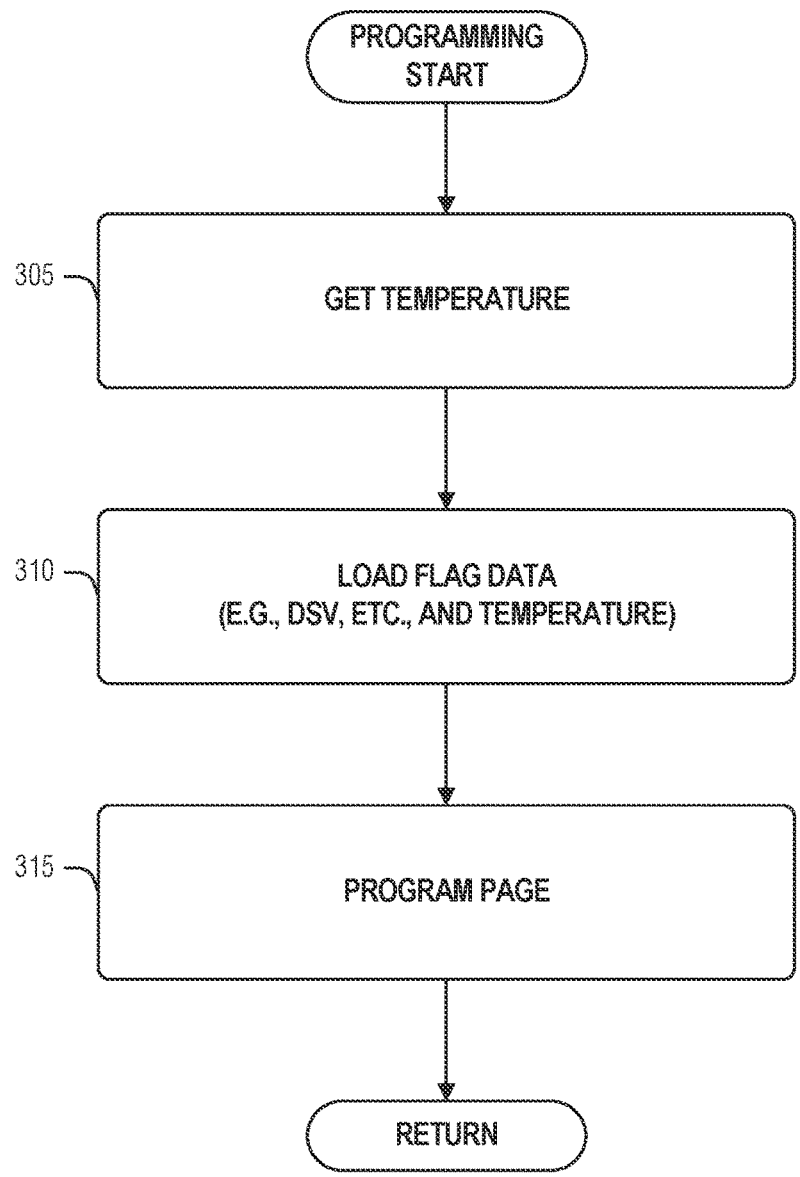
FIG. 3 illustrates a flowchart of a method for a NAND page write in accordance with NAND temperature-aware operations.

FIG. 3 illustrates a flowchart of a method 300 for a NAND page write in accordance with NAND temperature-aware operations. The operations of the method 300 are performed via hardware, such as that described above or below (e.g., processing circuitry).

When a NAND programming (e.g., writing) operation begins, a temperature for the NAND component being written to is obtained (operation 305). Once obtained, the temperature can be marshalled with other flag data, such as a Digital Sum Value (DSV), and prepared to be stored to the NAND array (operation 310). Once prepared, the flag data is written with the user data to the NAND array when the page is programmed (operation 315). In an example, for multiple-pass programming, such as occurs when the user data is encoded in MLC or TLC, the flag data is programmed during the final (e.g., second) programming pass.

Figure 4:
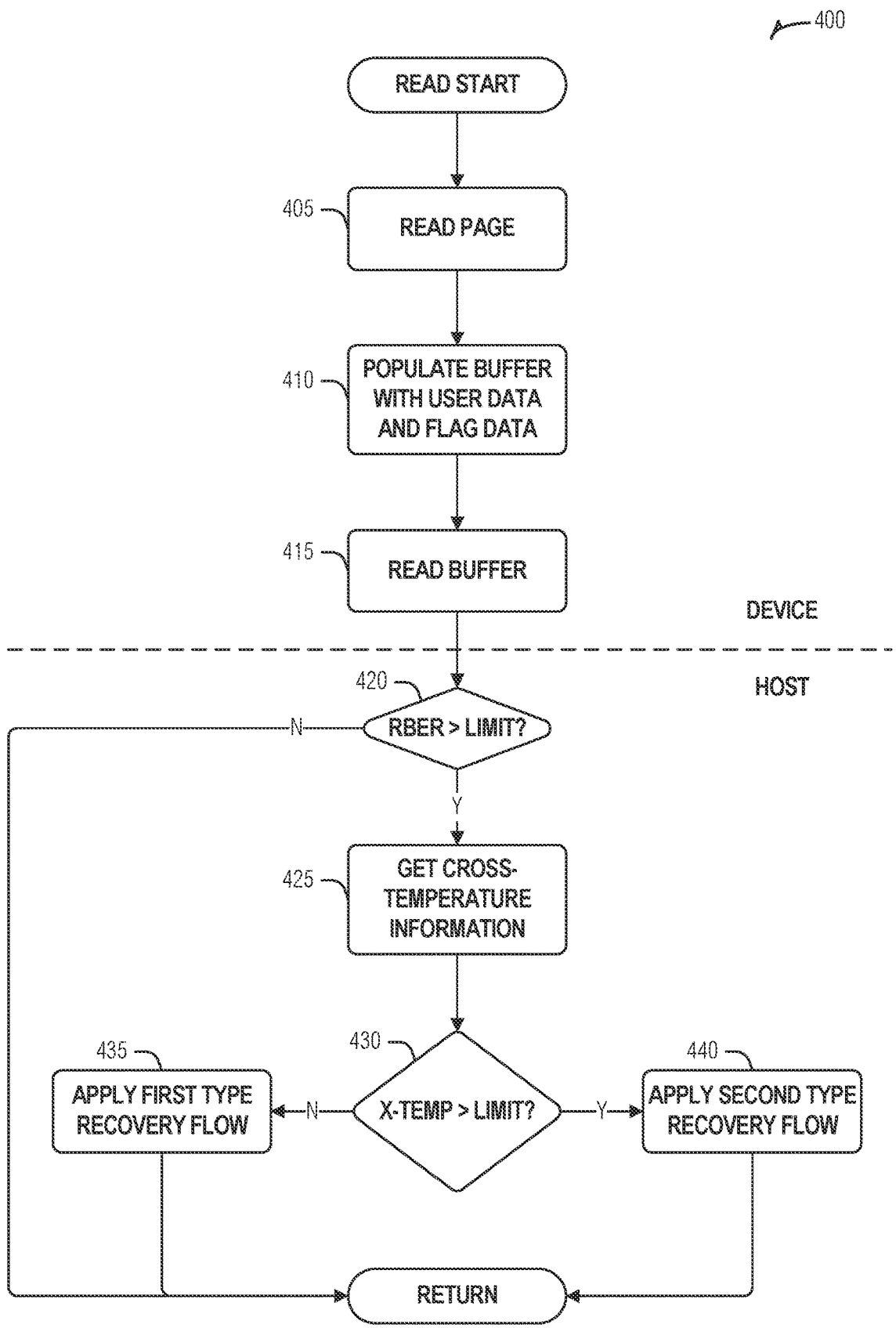
FIG. 4 illustrates a flowchart of a method for a NAND page read in accordance with NAND temperature-aware operations.

FIG. 4 illustrates a flowchart of a method 400 for a NAND page read in accordance with NAND temperature-aware operations. The operations of the method 400 are performed via hardware, such as that described above or below (e.g., processing circuitry).

When the read is performed, the NAND component in the NAND array, such as a target page, is read (operation 405). The NAND controller can then populate a local device buffer with the user data and the flag data (operation 410)—note that the flag data is read concurrently with the user data in accordance with the NAND array design. Once loaded, the user data and the flag data can be read from the buffer (operation 415), for example, by the host (or another requestor). To address cross temperature issues with the read, the RBER of the page is compared against a threshold (decision 420). If the RBER is not above the threshold, then the user data can be returned to complete the read request.

If the RBER is above the threshold, the cross temperature can be calculated from the temperature stored in the flag data and from a current temperature of the NAND device (e.g., ABS (current-temperature-stored-temperature) (operation 425). The cross-temperature can be compared to a second threshold (e.g., cross-temperature limit, etc.) (decision 430). The second threshold is used to select one of several recovery techniques. Thus, if the cross-temperature is not over the limit, a first type of recovery flow is applied to the user data (operation 435), and if not, a second type of recovery flow is applied to the user data (operation 440).

In an example, the calculated cross-temperature can be provided to other entities (e.g., from the NAND device to a host, via a bit alert (e.g., bit is one during a cross-temperature event and zero otherwise), by populating a feature address with the cross-temperature, etc. In an example, although the recovery flow starting at decision 420 or the method 400 is indicated to be performed by the host, the NAND controller in a managed NAND device, or the like, can perform these operations. This example can provide a more efficient host interaction in a variety of use cases.

Again, because the flag bytes are read concurrently with user data bytes (e.g., main data bytes), the temperature stored in the flag bytes is available to the NAND device following a read. The cross-temperature can be calculated and made available or used in several different ways. For example, the NAND device can provide a temperature alert on the status register to report the severity on the cross-temperature data (e.g., high, medium, low, etc.). In an example, the NAND device can update a register with the cross-temperature information (e.g., noted above). In an example, the NAND device can provide the cross-temperature information inside a Feature Address (e.g., as defined by an interface standard). In an example, the NAND device can update a register with best Read Retry (RR) recipe to compensate the cross-temperature. Here, the RR register entry can be an index to a data structure of RR recipes (e.g., procedures). In an example, the NAND device can self-calibrate read levels (e.g., trims) for an upcoming read operation based on previous cross-temperature information. In an example, the NAND device can derive a health report based on the temperature per page (e.g., reading all the flags and data at once).

Figure 5:
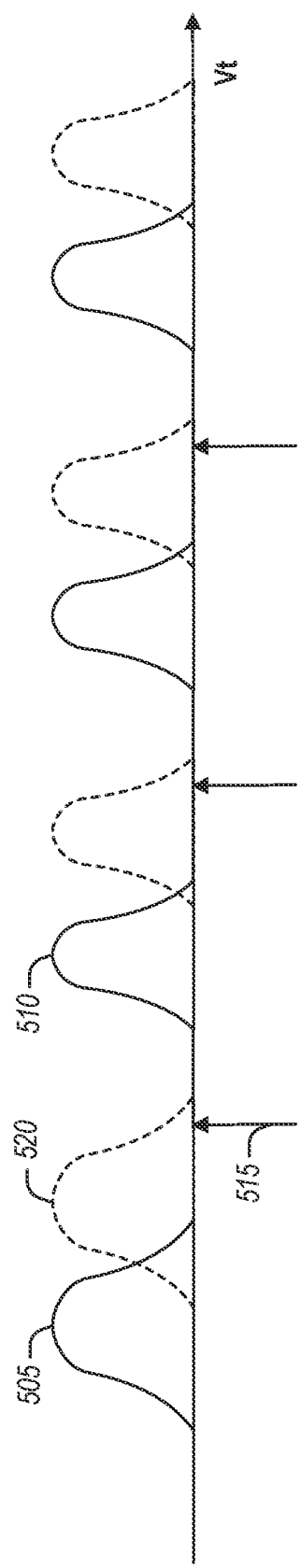
FIG. 5 illustrates an example of cell voltage drift during different temperature writing conditions.

FIG. 5 illustrates an example of cell voltage drift during different temperature writing conditions. For example, Threshold Voltage (Vt) distributions 505 and 510 are two states within a certain write temperature for which the read voltage 515 is calibrated. Thus, if the voltage 515 is applied to the control gate, a cell with a trapped charge within the distribution 505 will have an open channel, and the cell will have a closed channel if the trapped charge is in the distribution 510. The dashed distributions illustrate a cross-temperature result of writing at a high temperature. Here, the initial voltage distribution 520 corresponds to distribution 505, but has crossed the read voltage 515. Thus, application of the read voltage 515 on distribution 520 can result in a closed channel for the cell. This is an error. If, however, the controller were aware of the cross-temperature distributions, the read voltage 515 can be adjusted upwards to again fall between two different distributions.

Figure 6A:
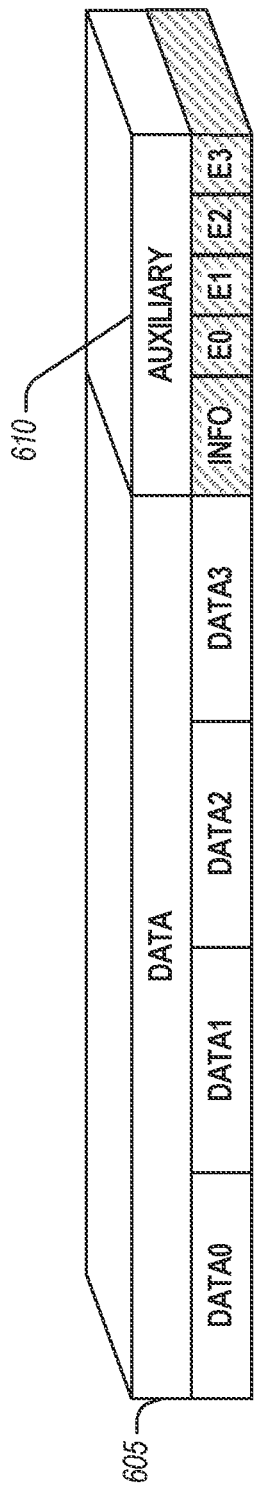
FIGS. 6A-6B illustrate storage configurations for NAND temperature data.
Figure 6B:
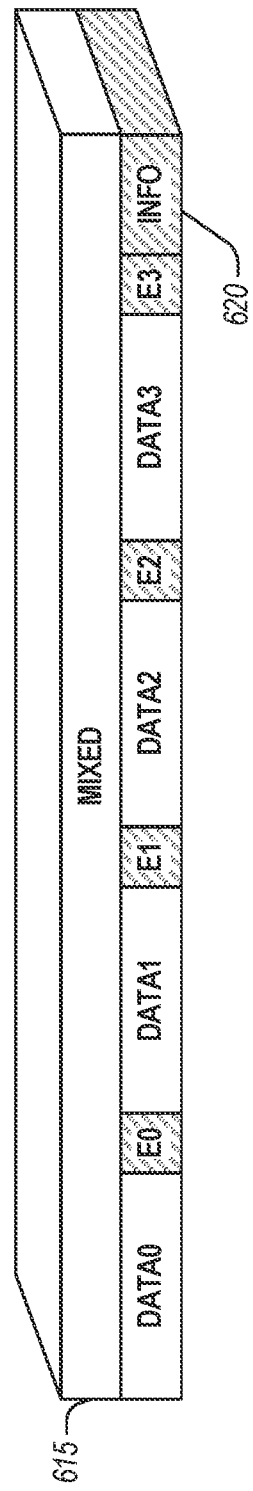

FIGS. 6A-6B illustrate storage configurations for NAND temperature data. FIG. 6A illustrates an organization where a dedicated portion of the page is set-aside for controller metadata, such as the flag bytes or ECCs. Thus, the page is divided in the user data portion 605 and the auxiliary bytes portion 610. The temperature data can be stored in the auxiliary bytes portion, such as in the segment marked "INFO." In contrast, FIG. 6B illustrates an alternative organization in which the auxiliary bytes are interspersed throughout the use data segments, resulting in a heterogenous portion 615. However, the "INFO" auxiliary bytes 620 are still located on the page and can store the temperature data of the page when it was last written.

Figure 7:
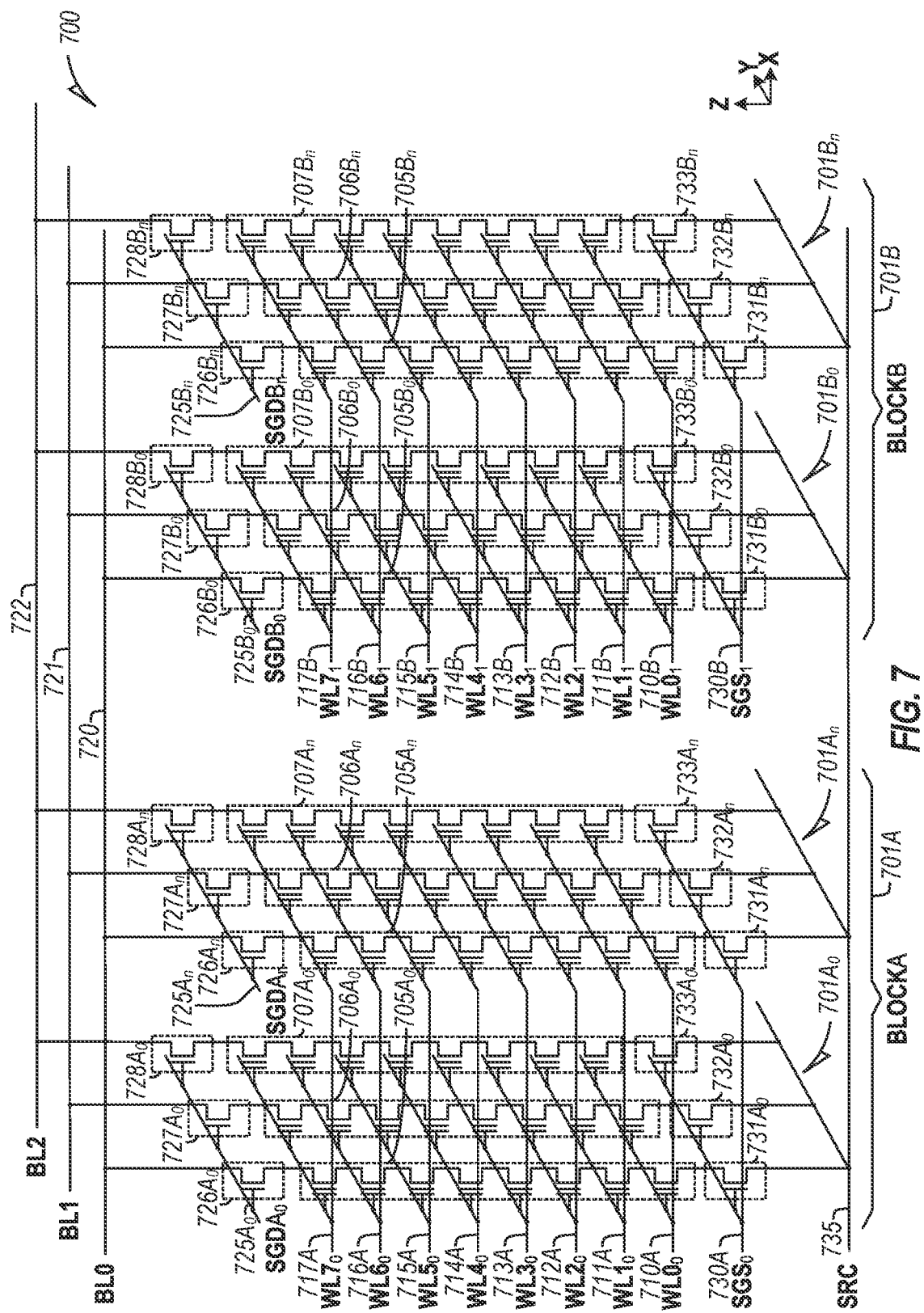
FIGS. 7-8 illustrate schematic diagrams of an example of a 3D NAND architecture semiconductor memory array.

FIG. 7 illustrates an example schematic diagram of a 3D NAND architecture semiconductor memory array 700 including a number of strings of memory cells (e.g., first-third $A_0$ memory strings 505$A_0$-507$A_0$, first-third $A_n$ memory strings 505$A_n$-507$A_n$, first-third $B_0$ memory strings 505$B_0$-507$B_n$, first-third $B_n$ memory strings 505$B_n$-507$B_n$, etc.), organized in blocks (e.g., block A 501A, block B 501B, etc.) and sub-blocks (e.g., sub-block $A_0$ 501$A_0$, sub-block $A_n$ 501$A_n$, sub-block $B_0$ 501$B_0$, sub-block $B_n$, 501$B_n$, etc.). The memory array 700 represents a portion of a greater number of similar structures that would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 735 or a source-side select gate (SGS) (e.g., first-third $A_0$ SGS 731$A_0$-733$A_0$, first-third $A_n$ SGS 731$A_n$-733$A_n$, first-third $B_0$ SGS 731$B_0$-733$B_0$, first-third $B_n$ SGS 731$B_n$-733$B_n$, etc.) and a drain-side select gate (SGD) (e.g., first-third $A_0$ SGD 726$A_0$-728$A_0$, first-third $A_n$ SGD 726$A_n$-728$A_n$, first-third $B_0$ SGD 726$B_0$-728$B_0$, first-third $B_n$ SGD 726$B_n$-728$B_n$, etc.). Each string of memory cells in the 3D memory array can be arranged along the X direction as data lines (e.g., bit lines (BL) BL0-BL2 720-722), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 556, 684, etc.). Although illustrated herein as having two blocks, each block having two sub-blocks, each sub-block having a single physical page, each physical page having three strings of memory cells, and each string having 8 tiers of memory cells, in other examples, the memory array 700 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,684+5208 bytes), 1536 pages per block, 548 blocks per plane, and 4 or more planes per device.

Each memory cell in the memory array 700 includes a control gate (CG) coupled to (e.g., electrically or otherwise operatively connected to) an access line (e.g., word lines (WL) $WL0_0$-$WL7_0$ 510A-517A, $WL0_1$-$WL7_1$ 510B-517B, etc.), which collectively couples the control gates (CGs) across a specific tier, or a portion of a tier, as desired. Specific tiers in the 3D memory array, and accordingly, specific memory cells in a string, can be accessed or controlled using respective access lines. Groups of select gates can be accessed using various select lines. For example, first-third $A_0$ SGD 526$A_0$-528$A_0$ can be accessed using an $A_0$ SGD line SGD$A_0$ 525$A_0$, first-third $A_n$ SGD 526$A_n$-528$A_n$ can be accessed using an SGD line SGD$A_n$ 525$A_n$, first-third $B_0$ SGD 526$B_0$-528$B_0$ can be accessed using an $B_0$ SGD line SGD$B_0$ 525$B_0$, and first-third $B_n$ SGD 526$B_n$-528$B_n$ can be accessed using an $B_n$ SGD line SGD$B_n$ 525$B_n$. First-third $A_0$ SGS 531$A_0$-533$A_0$ and first-third $A_n$ SGS 531$A_n$-533$A_n$ can be accessed using a gate select line SGS$_0$ 530A, and first-third $B_0$ SGS 531$B_0$-533$B_0$ and first-third $B_n$ SGS 531$B_n$-533$B_n$ can be accessed using a gate select line SGS$_1$ 530B.

In an example, the memory array 700 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

Figure 8:
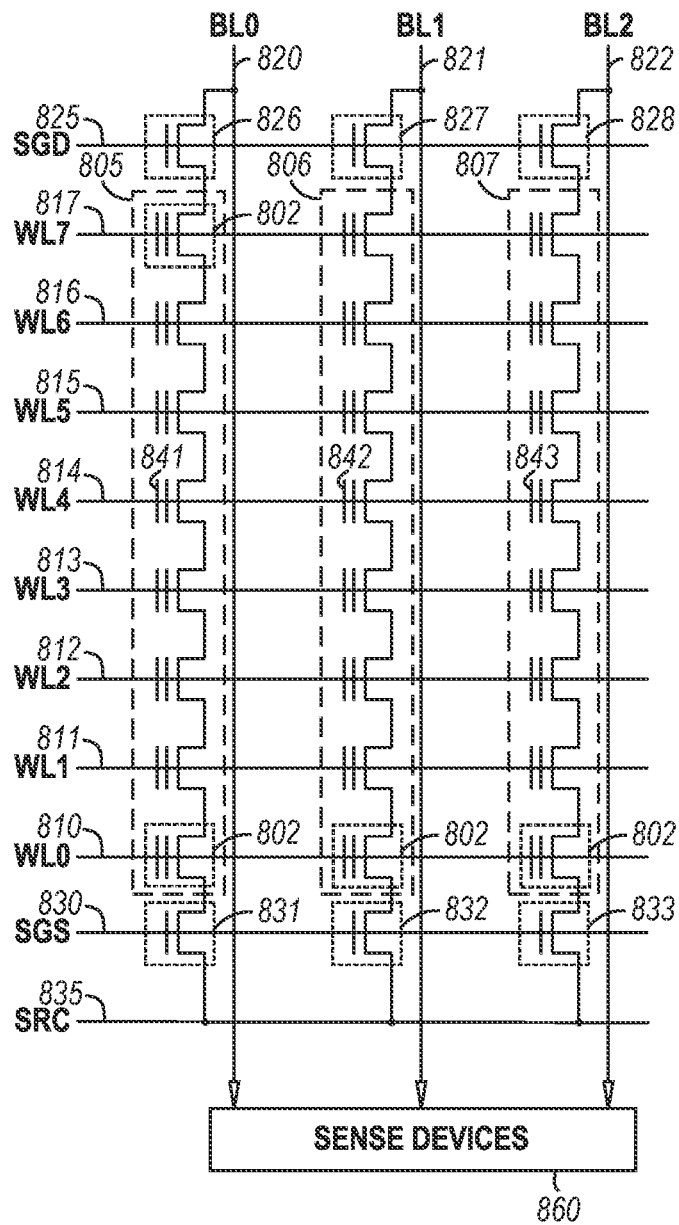

FIG. 8 illustrates an example schematic diagram of a portion of a NAND architecture semiconductor memory array 800 including a plurality of memory cells 802 arranged in a two-dimensional array of strings (e.g., first-third strings 805-807) and tiers (e.g., illustrated as respective word lines (WL) WL0-WL7 810-817, a drain-side select gate (SGD) line 825, a source-side select gate (SGS) line 830, etc.), and sense amplifiers or devices 860. For example, the memory array 800 can illustrate an example schematic diagram of a portion of one physical page of memory cells of a 3D NAND architecture semiconductor memory device, such as illustrated in FIG. 5.

Each string of memory cells is coupled to a source (SRC) line 835 using a respective source-side select gate (SGS) (e.g., first-third SGS 831-833), and to a respective data line (e.g., first-third bit lines (BL) BL0-BL2 820-822) using a respective drain-side select gate (SGD) (e.g., first-third SGD 826-828). Although illustrated with 8 tiers (e.g., using word lines (WL) WL0-WL7 810-817) and three data lines (BL0-BL2 826-828) in the example of FIG. 8, other examples can include strings of memory cells having more or fewer tiers or data lines, as desired.

In a NAND architecture semiconductor memory array, such as the example memory array 800, the state of a selected memory cell 802 can be accessed by sensing a current or voltage variation associated with a particular data line containing the selected memory cell. The memory array 800 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL4), and thus, to a control gate of each memory cell coupled to the selected word lines (e.g., first-third control gates (CGs) 841-843 of the memory cells coupled to WL4). Programming pulses can begin, for example, at or near 15V and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as WL4, a pass voltage of 10V can be applied to one or more other word lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of word lines, etc., can be higher or lower, or more or less.

The sense amplifiers 860, coupled to one or more of the data lines (e.g., first, second, or third bit lines (BL0-BL2) 820-822), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the floating gates of the targeted memory cells to the channels.

Figure 9:
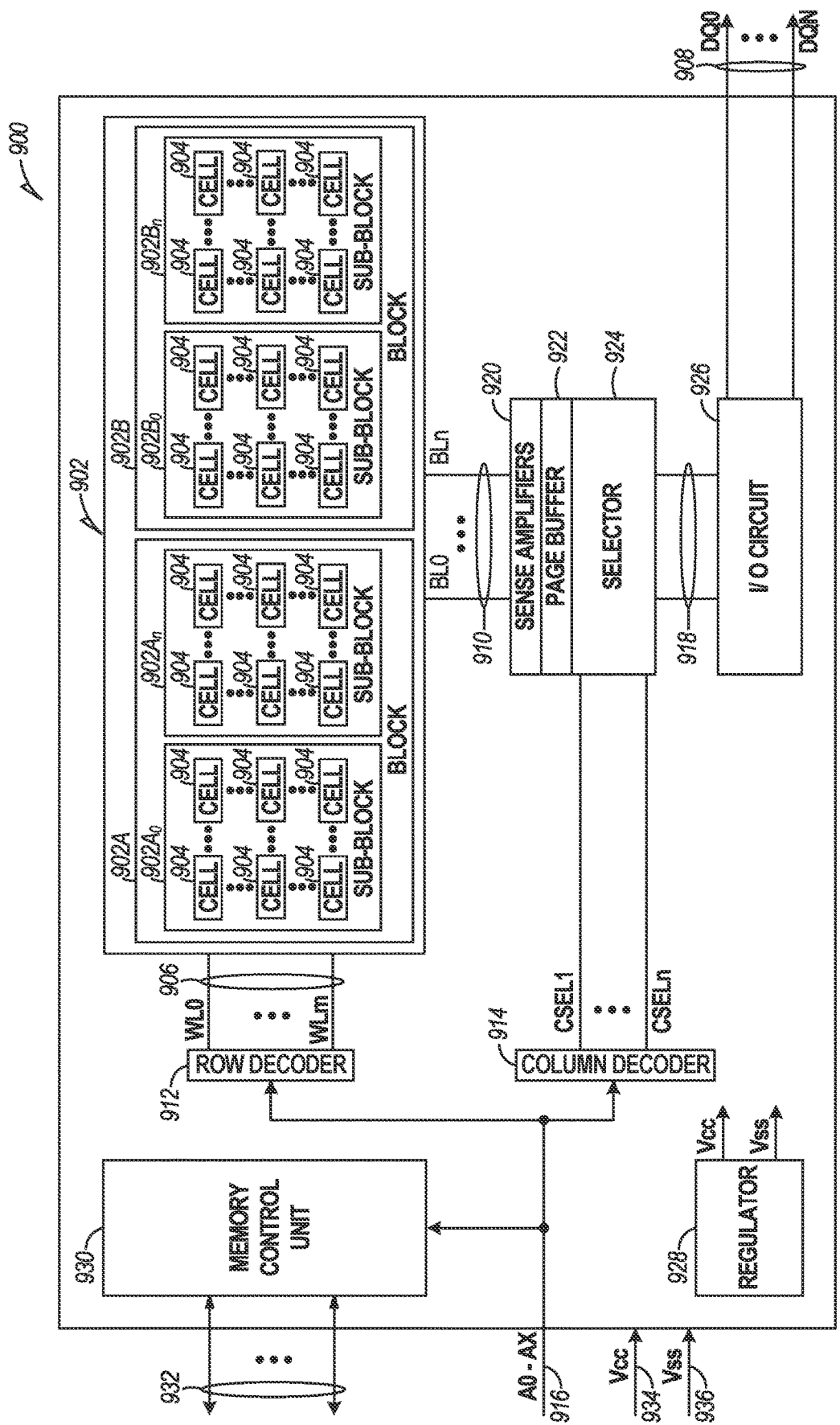
FIG. 9 illustrates an example block diagram of a memory module.

FIG. 9 illustrates an example block diagram of a memory device 900 including a memory array 902 having a plurality of memory cells 904, and one or more circuits or components to provide communication with, or perform one or more memory operations on, the memory array 902. The memory device 900 can include a row decoder 912, a column decoder 914, sense amplifiers 920, a page buffer 922, a selector 924, an input/output (I/O) circuit 926, and a memory control unit 930.

The memory cells 904 of the memory array 902 can be arranged in blocks, such as first and second blocks 902A, 902B. Each block can include sub-blocks. For example, the first block 902A can include first and second sub-blocks 902A0, 902An, and the second block 902B can include first and second sub-blocks 902B0, 902Bn. Each sub-block can include a number of physical pages, each page including a number of memory cells 904. Although illustrated herein as having two blocks, each block having two sub-blocks, and each sub-block having a number of memory cells 904, in other examples, the memory array 902 can include more or fewer blocks, sub-blocks, memory cells, etc. In other examples, the memory cells 904 can be arranged in a number of rows, columns, pages, sub-blocks, blocks, etc., and accessed using, for example, access lines 906, first data lines 910, or one or more select gates, source lines, etc.

The memory control unit 930 can control memory operations of the memory device 900 according to one or more signals or instructions received on control lines 932, including, for example, one or more clock signals or control signals that indicate a desired operation (e.g., write, read, erase, etc.), or address signals (A0-AX) received on one or more address lines 916. One or more devices external to the memory device 900 can control the values of the control signals on the control lines 932, or the address signals on the address line 916. Examples of devices external to the memory device 900 can include, but are not limited to, a host, a memory controller, a processor, or one or more circuits or components not illustrated in FIG. 9.

The memory device 900 can use access lines 906 and first data lines 910 to transfer data to (e.g., write or erase) or from (e.g., read) one or more of the memory cells 904. The row decoder 912 and the column decoder 914 can receive and decode the address signals (A0-AX) from the address line 916, can determine which of the memory cells 904 are to be accessed, and can provide signals to one or more of the access lines 906 (e.g., one or more of a plurality of word lines (WL0-WLm)) or the first data lines 910 (e.g., one or more of a plurality of bit lines (BL0-BLn)), such as described above.

The memory device 900 can include sense circuitry, such as the sense amplifiers 920, configured to determine the values of data on (e.g., read), or to determine the values of data to be written to, the memory cells 904 using the first data lines 910. For example, in a selected string of memory cells 904, one or more of the sense amplifiers 920 can read a logic level in the selected memory cell 904 in response to a read current flowing in the memory array 902 through the selected string to the data lines 910.

One or more devices external to the memory device 900 can communicate with the memory device 900 using the I/O lines (DQ0-DQN) 908, address lines 916 (A0-AX), or control lines 932. The input/output (I/O) circuit 926 can transfer values of data in or out of the memory device 900, such as in or out of the page buffer 922 or the memory array 902, using the I/O lines 908, according to, for example, the control lines 932 and address lines 916. The page buffer 922 can store data received from the one or more devices external to the memory device 900 before the data is programmed into relevant portions of the memory array 902, or can store data read from the memory array 902 before the data is transmitted to the one or more devices external to the memory device 900.

The column decoder 914 can receive and decode address signals (A0-AX) into one or more column select signals (CSEL1-CSELn). The selector 924 (e.g., a select circuit) can receive the column select signals (CSEL1-CSELn) and select data in the page buffer 922 representing values of data to be read from or to be programmed into memory cells 904. Selected data can be transferred between the page buffer 922 and the I/O circuit 926 using second data lines 918.

The memory control unit 930 can receive positive and negative supply signals, such as a supply voltage (Vcc) 934 and a negative supply (Vss) 936 (e.g., a ground potential), from an external source or supply (e.g., an internal or external battery, an AC-to-DC converter, etc.). In certain examples, the memory control unit 930 can include a regulator 928 to internally provide positive or negative supply signals.

Figure 10:
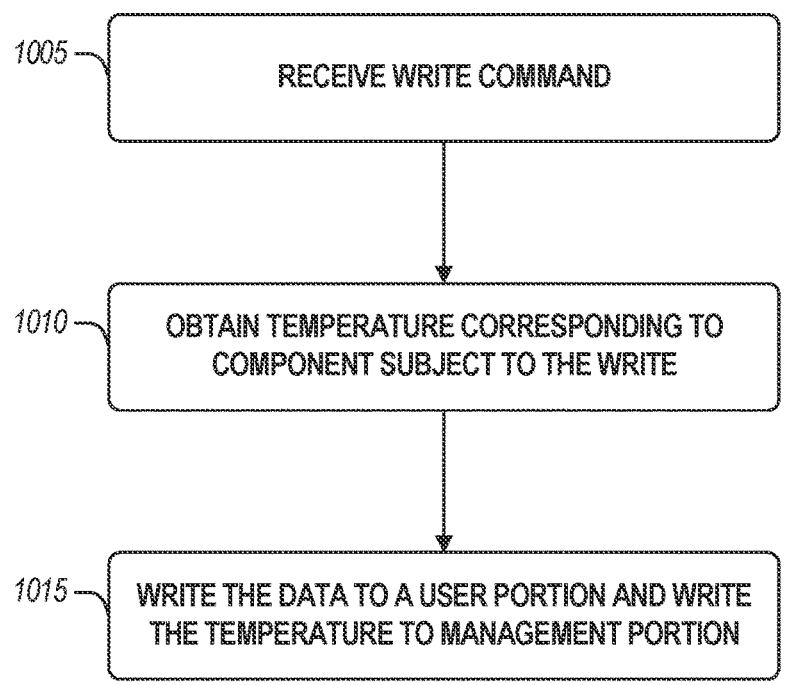
FIG. 10 illustrates a flowchart of a method for NAND temperature-aware operations.

FIG. 10 illustrates a flowchart of a method 1000 for NAND temperature-aware operations. The operations of the method 1000 are performed by hardware, such as that described above or below (e.g., processing circuitry).

At operation 1005, a command to write data to a NAND component in the NAND device is received (e.g., at a NAND controller).

At operation 1010, a temperature corresponding to the NAND component is obtained in response to receiving the command. In an example, obtaining the temperature includes retrieving the temperature from a buffer. In this example, a thermometer (e.g., embedded in the NAND device) periodically measures the temperature and stores the temperature in the buffer. In an example, obtaining the temperature includes receiving or retrieving the temperature from a thermometer (e.g., embedded in the NAND device) in response to receiving the command.

At operation 1015, the command to write data to the NAND component is executed. As part of this, the temperature is written into a management portion of the NAND device that is separate from a user portion of the NAND device to which the data is written. In an example, the management portion is on the NAND component. In an example, the NAND component is a page. In an example, the management portion is flag bytes of the page. In an example, the management portion is programmed using a single-level cell (SLC) encoding. In an example, the user portion is programmed using an encoding with a greater density than the SLC encoding, such as MLC or TLC encoding. In an example, the management portion is encoded with error correction (e.g., ECC, Gray codes, etc.)

The operations of the method 1000 can be extended to include reading the data from the NAND component and reading the temperature in response to a read error metric being over a threshold. In an example, reading the data and the temperature includes comparing the temperature to a second threshold. A cross-temperature read-recovery operation can then be performed in response to the temperature being beyond the second threshold. In an example, the temperature is provided to a host invoking the read command. In an example, the host uses the temperature to implement the cross-temperature read-recovery operation.

The operations of the method 1000 can be extended to include modifying a maintenance operation on the NAND component based on the temperature stored in the management portion. In an example, the maintenance operation is a refresh of the NAND component. Here, modifying the maintenance operation includes adjusting thresholds to perform the refresh based on the temperature. In an example, the maintenance operation is a retirement of the NAND component. Here, modifying the maintenance operation includes adjusting thresholds to perform the retirement based on the temperature.

Figure 11:
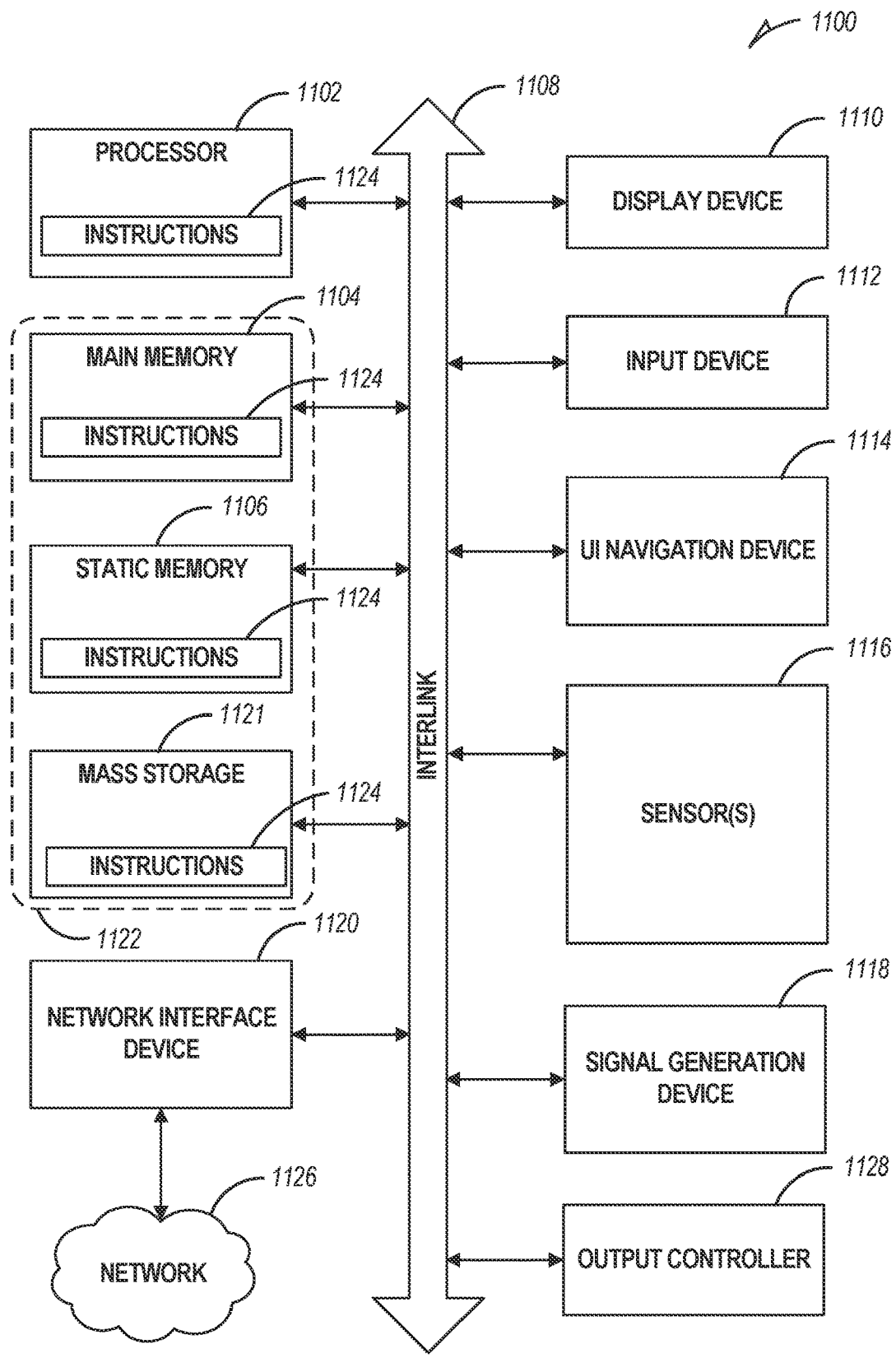
FIG. 11 is a block diagram illustrating an example of a machine upon which one or more embodiments can be implemented.

FIG. 11 illustrates a block diagram of an example machine 1100 upon which any one or more of the techniques (e.g., methodologies) discussed herein can perform. In alternative embodiments, the machine 1100 can operate as a standalone device or can be connected (e.g., networked) to other machines. In a networked deployment, the machine 1100 can operate in the capacity of a server machine, a client machine, or both in server-client network environments. In an example, the machine 1100 can act as a peer machine in peer-to-peer (P2P) (or other distributed) network environment. The machine 1100 can be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, can include, or can operate by, logic, components, devices, packages, or mechanisms. Circuitry is a collection (e.g., set) of circuits implemented in tangible entities that include hardware (e.g., simple circuits, gates, logic, etc.). Circuitry membership can be flexible over time and underlying hardware variability. Circuitries include members that can, alone or in combination, perform specific tasks when operating. In an example, hardware of the circuitry can be immutably designed to carry out a specific operation (e.g., hardwired). In an example, the hardware of the circuitry can include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer readable medium is communicatively coupled to the other components of the circuitry when the device is operating. In an example, any of the physical components can be used in more than one member of more than one circuitry. For example, under operation, execution units can be used in a first circuit of a first circuitry at one point in time and reused by a second circuit in the first circuitry, or by a third circuit in a second circuitry at a different time.

The machine (e.g., computer system) 1100 (e.g., the host device 105, the memory device 110, etc.) can include a hardware processor 1102 (e.g., a central processing unit (CPU), a graphics processing unit (GPU), a hardware processor core, or any combination thereof, such as the memory controller 115, etc.), a main memory 1104 and a static memory 1106, some or all of which can communicate with each other via an interlink (e.g., bus) 1108. The machine 1100 can further include a display unit 1110, an alphanumeric input device 1112 (e.g., a keyboard), and a user interface (UI) navigation device 1114 (e.g., a mouse). In an example, the display unit 1110, input device 1112 and UI navigation device 1114 can be a touch screen display. The machine 1100 can additionally include a storage device (e.g., drive unit), a signal generation device 1118 (e.g., a speaker), a network interface device 1120, and one or more sensors 1116, such as a global positioning system (GPS) sensor, compass, accelerometer, or other sensor. The machine 1100 can include an output controller 1128, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device can include a machine readable medium 1122 on which is stored one or more sets of data structures or instructions 1124 (e.g., software) embodying or utilized by any one or more of the techniques or functions described herein. The instructions 1124 can also reside, completely or at least partially, within the main memory 1104, within static memory 1106, or within the hardware processor 1102 during execution thereof by the machine 1100. In an example, one or any combination of the hardware processor 1102, the main memory 1104, the static memory 1106, or the storage device can constitute the machine readable medium 1122.

While the machine readable medium 1122 is illustrated as a single medium, the term "machine readable medium" can include a single medium or multiple media (e.g., a centralized or distributed database, or associated caches and servers) configured to store the one or more instructions 1124.

The term "machine readable medium" can include any medium that is capable of storing, encoding, or carrying instructions for execution by the machine 1100 and that cause the machine 1100 to perform any one or more of the techniques of the present disclosure, or that is capable of storing, encoding or carrying data structures used by or associated with such instructions. Non-limiting machine readable medium examples can include solid-state memories, and optical and magnetic media. In an example, a massed machine readable medium comprises a machine-readable medium with a plurality of particles having invariant (e.g., rest) mass. Accordingly, massed machine-readable media are not transitory propagating signals. Specific examples of massed machine readable media can include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 1124 (e.g., software, programs, an operating system (OS), etc.) or other data are stored on the storage device 1121, can be accessed by the memory 1104 for use by the processor 1102. The memory 1104 (e.g., DRAM) is typically fast, but volatile, and thus a different type of storage than the storage device 1121 (e.g., an SSD), which is suitable for long-term storage, including while in an "off" condition. The instructions 1124 or data in use by a user or the machine 1100 are typically loaded in the memory 1104 for use by the processor 1102. When the memory 1104 is full, virtual space from the storage device 1121 can be allocated to supplement the memory 1104; however, because the storage device 1121 is typically slower than the memory 1104, and write speeds are typically at least twice as slow as read speeds, use of virtual memory can greatly reduce user experience due to storage device latency (in contrast to the memory 1104, e.g., DRAM). Further, use of the storage device 1121 for virtual memory can greatly reduce the usable lifespan of the storage device 1121.

In contrast to virtual memory, virtual memory compression (e.g., the Linux® kernel feature "ZRAM") uses part of the memory as compressed block storage to avoid paging to the storage device 1121. Paging takes place in the compressed block until it is necessary to write such data to the storage device 1121. Virtual memory compression increases the usable size of memory 1104, while reducing wear on the storage device 1121.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device, and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 1124 can further be transmitted or received over a communications network 1126 using a transmission medium via the network interface device 1120 utilizing any one of a number of transfer protocols (e.g., frame relay, Internet protocol (IP), transmission control protocol (TCP), user datagram protocol (UDP), hypertext transfer protocol (HTTP), etc.). Example communication networks can include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 1120 can include one or more physical jacks (e.g., Ethernet, coaxial, or phone jacks) or one or more antennas to connect to the communications network 1126. In an example, the network interface device 1120 can include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 1100, and includes digital or analog communications signals or other intangible medium to facilitate communication of such software.

Additional Examples

Example 1 is a device for NAND temperature-aware operations, the device comprising: a NAND array including a NAND component; and a controller to: receive a command to write data to the NAND component; obtain a temperature corresponding to the NAND component in response to receipt of the command; and execute the command to write data to the NAND component, wherein to execute the command, the controller writes the temperature into a management portion of the NAND device that is separate from a user portion of the NAND device to which the data is written.

In Example 2, the subject matter of Example 1, wherein the controller is arranged to read the data from the NAND component and reads the temperature in response to a read error metric being over a threshold.

In Example 3, the subject matter of Example 2, wherein, to read the data and the temperature, the controller: compares the temperature to a second threshold; and performs a cross-temperature read-recovery operation in response to the temperature being beyond the threshold.

In Example 4, the subject matter of Example 3, wherein the temperature is provided to a host invoking the read command, and wherein the host uses the temperature to implement the cross-temperature read-recovery operation.

In Example 5, the subject matter of any of Examples 1-4, wherein the controller is arranged to modify a maintenance operation on the NAND component based on the temperature stored in the management portion.

In Example 6, the subject matter of Example 5, wherein the maintenance operation is a refresh of the NAND component, and wherein, to modify the maintenance operation, the controller adjusts thresholds to perform the refresh based on the temperature.

In Example 7, the subject matter of any of Examples 5-6, wherein the maintenance operation is a retirement of the NAND component, and wherein, to modify the maintenance operation, the controller adjusts thresholds to perform the retirement based on the temperature.

In Example 8, the subject matter of any of Examples 1-7, wherein the management portion is on the NAND component.

In Example 9, the subject matter of Example 8, wherein the NAND component is a page.

In Example 10, the subject matter of Example 9, wherein the management portion is flag bytes of the page.

In Example 11, the subject matter of Example 10, wherein the management portion is programmed using a single-level cell (SLC) encoding, and wherein the user portion is programmed using an encoding with a greater density than the SLC encoding.

In Example 12, the subject matter of any of Examples 10-11, wherein the management portion is encoded with error correction.

In Example 13, the subject matter of any of Examples 1-12, wherein, to obtain the temperature, the controller obtains the temperature from a thermometer in response to receiving the command.

In Example 14, the subject matter of any of Examples 1-13, wherein, to obtain the temperature, the controller obtains the temperature from a buffer, a thermometer periodically measuring the temperature and storing the temperature in the buffer.

Example 15 is a method for NAND temperature-aware operations, the method comprising: receiving, at a controller of a NAND device, a command to write data to a NAND component in the NAND device; obtaining a temperature corresponding to the NAND component in response to receiving the command; and executing the command to write data to the NAND component including writing the temperature into a management portion of the NAND device that is separate from a user portion of the NAND device to which the data is written.

In Example 16, the subject matter of Example 15, comprising reading the data from the NAND component and reading the temperature in response to a read error metric being over a threshold.

In Example 17, the subject matter of Example 16, wherein reading the data and the temperature includes: comparing the temperature to a second threshold; and performing a cross-temperature read-recovery operation in response to the temperature being beyond the threshold.

In Example 18, the subject matter of Example 17, wherein the temperature is provided to a host invoking the read command, and wherein the host uses the temperature to implement the cross-temperature read-recovery operation.

In Example 19, the subject matter of any of Examples 15-48, comprising modifying a maintenance operation on the NAND component based on the temperature stored in the management portion.

In Example 20, the subject matter of Example 19, wherein the maintenance operation is a refresh of the NAND component, and wherein modifying the maintenance operation includes adjusting thresholds to perform the refresh based on the temperature.

In Example 21, the subject matter of any of Examples 19-20, wherein the maintenance operation is a retirement of the NAND component, and wherein modifying the maintenance operation includes adjusting thresholds to perform the retirement based on the temperature.

In Example 22, the subject matter of any of Examples 15-21, wherein the management portion is on the NAND component.

In Example 23, the subject matter of Example 22, wherein the NAND component is a page.

In Example 24, the subject matter of Example 23, wherein the management portion is flag bytes of the page.

In Example 25, the subject matter of Example 24, wherein the management portion is programmed using a single-level cell (SLC) encoding, and wherein the user portion is programmed using an encoding with a greater density than the SLC encoding.

In Example 26, the subject matter of any of Examples 24-25, wherein the management portion is encoded with error correction.

In Example 27, the subject matter of any of Examples 15-26, wherein obtaining the temperature includes obtaining the temperature from a thermometer in response to receiving the command.

In Example 28, the subject matter of any of Examples 15-27, wherein obtaining the temperature includes obtaining the temperature from a buffer, a thermometer periodically measuring the temperature and storing the temperature in the buffer.

Example 29 is a machine readable medium including instructions for NAND temperature-aware operations, the instructions, when executed by a machine, cause the machine to perform operations comprising: receiving, at a controller of a NAND device, a command to write data to a NAND component in the NAND device; obtaining a temperature corresponding to the NAND component in response to receiving the command; and executing the command to write data to the NAND component including writing the temperature into a management portion of the NAND device that is separate from a user portion of the NAND device to which the data is written.

In Example 30, the subject matter of Example 29, wherein the operations include reading the data from the NAND component and reading the temperature in response to a read error metric being over a threshold.

In Example 31, the subject matter of Example 30, wherein reading the data and the temperature includes: comparing the temperature to a second threshold; and performing a cross-temperature read-recovery operation in response to the temperature being beyond the threshold.

In Example 32, the subject matter of Example 31, wherein the temperature is provided to a host invoking the read command, and wherein the host uses the temperature to implement the cross-temperature read-recovery operation.

In Example 33, the subject matter of any of Examples 29-32, wherein the operations include modifying a maintenance operation on the NAND component based on the temperature stored in the management portion.

In Example 34, the subject matter of Example 33, wherein the maintenance operation is a refresh of the NAND component, and wherein modifying the maintenance operation includes adjusting thresholds to perform the refresh based on the temperature.

In Example 35, the subject matter of any of Examples 33-34, wherein the maintenance operation is a retirement of the NAND component, and wherein modifying the maintenance operation includes adjusting thresholds to perform the retirement based on the temperature.

In Example 36, the subject matter of any of Examples 29-35, wherein the management portion is on the NAND component.

In Example 37, the subject matter of Example 36, wherein the NAND component is a page.

In Example 38, the subject matter of Example 37, wherein the management portion is flag bytes of the page.

In Example 39, the subject matter of Example 38, wherein the management portion is programmed using a single-level cell (SLC) encoding, and wherein the user portion is programmed using an encoding with a greater density than the SLC encoding.

In Example 40, the subject matter of any of Examples 38-39 wherein the management portion is encoded with error correction.

In Example 41, the subject matter of any of Examples 29-40, wherein obtaining the temperature includes obtaining the temperature from a thermometer in response to receiving the command.

In Example 42, the subject matter of any of Examples 29-41, wherein obtaining the temperature includes obtaining the temperature from a buffer, a thermometer periodically measuring the temperature and storing the temperature in the buffer.

Example 43 is a system for NAND temperature-aware operations, the system comprising: means for receiving, at a controller of a NAND device, a command to write data to a NAND component in the NAND device; means for obtaining a temperature corresponding to the NAND component in response to receiving the command; and means for executing the command to write data to the NAND component including writing the temperature into a management portion of the NAND device that is separate from a user portion of the NAND device to which the data is written.

In Example 44, the subject matter of Example 43, comprising means for reading the data from the NAND component and reading the temperature in response to a read error metric being over a threshold.

In Example 45, the subject matter of Example 44, wherein the means for reading the data and the temperature include: means for comparing the temperature to a second threshold; and means for performing a cross-temperature read-recovery operation in response to the temperature being beyond the threshold.

In Example 46, the subject matter of Example 45, wherein the temperature is provided to a host invoking the read command, and wherein the host uses the temperature to implement the cross-temperature read-recovery operation.

In Example 47, the subject matter of any of Examples 43-46, comprising means for modifying a maintenance operation on the NAND component based on the temperature stored in the management portion.

In Example 48, the subject matter of Example 47, wherein the maintenance operation is a refresh of the NAND component, and wherein the means for modifying the maintenance operation include means for adjusting thresholds to perform the refresh based on the temperature.

In Example 49, the subject matter of any of Examples 47-48, wherein the maintenance operation is a retirement of the NAND component, and wherein the means for modifying the maintenance operation include means for adjusting thresholds to perform the retirement based on the temperature.

In Example 50, the subject matter of any of Examples 43-49, wherein the management portion is on the NAND component.

In Example 51, the subject matter of Example 50, wherein the NAND component is a page.

In Example 52, the subject matter of Example 51, wherein the management portion is flag bytes of the page.

In Example 53, the subject matter of Example 52, wherein the management portion is programmed using a single-level cell (SLC) encoding, and wherein the user portion is programmed using an encoding with a greater density than the SLC encoding.

In Example 54, the subject matter of any of Examples 52-53, wherein the management portion is encoded with error correction.

In Example 55, the subject matter of any of Examples 43-54, wherein the means for obtaining the temperature include means for obtaining the temperature from a thermometer in response to receiving the command.

In Example 56, the subject matter of any of Examples 43-55, wherein the means for obtaining the temperature include means for obtaining the temperature from a buffer, a thermometer periodically measuring the temperature and storing the temperature in the buffer.

Example 57 is at least one machine-readable medium including instructions that, when executed by processing circuitry, cause the processing circuitry to perform operations to implement of any of Examples 1-56.

Example 58 is an apparatus comprising means to implement of any of Examples 1-56.

Example 59 is a system to implement of any of Examples 1-56.

Example 60 is a method to implement of any of Examples 1-56.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" can include "A but not B," "B but not A," and "A and B/" unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

Operating a memory cell, as used herein, includes reading from, writing to, or erasing the memory cell. The operation of placing a memory cell in an intended state is referred to herein as "programming," and can include both writing to or erasing from the memory cell (e.g., the memory cell can be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device can be configured to provide wear cycle information to the memory device with each memory operation. The memory device control circuitry (e.g., control logic) can be programmed to compensate for memory device performance changes corresponding to the wear cycle information. The memory device can receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements can be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code can form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMS), read only memories (ROMs), solid state drives (SSDs), Universal Flash Storage (UFS) device, embedded MMC (eMMC) device, and the like.

The above description is intended to be illustrative, and not restrictive. For example, the above-described examples (or one or more aspects thereof) can be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A storage device comprising:
a NAND array that includes a NAND component; and
a controller configured to:
   receive a command to write data to the NAND component;
   obtain a temperature corresponding to the NAND component in response to the receipt of the command;
   execute the command to write the data to the NAND component including the controller configured to:
      calculate an error correction code (ECC) for the data being written to the NAND component;
      write the calculated ECC to ECC bytes in a management portion of the storage device that is separate from a user portion of the storage device to which the data is written, wherein the ECC bytes into which the temperature is written includes unused ECC bytes, wherein the unused ECC bytes are excess bits in a space pre-dedicated by the controller to hold an ECC for the NAND component and distinct from flag bytes; and
      write the temperature to the unused ECC bytes along with the calculated ECC;
   receive a read command to read the data from the NAND component;
   read, in response to the read command, the data from the user portion and the temperature from the management portion concurrently from the NAND component;
   provide, to a host invoking the read command, the temperature from the management portion as part of a response to the host of the read command that includes the data from the user portion, and in response to a cross temperature event, provide a representation of the temperature as an alert as part of the response to the host of the read command; and
   enable a recovery operation using the temperature read from the NAND component.

2. The storage device of claim 1, wherein the enabling of the recovery operation using the temperature includes the controller to:
   compare the temperature to a threshold; and
   perform a cross-temperature read-recovery operation in response to the temperature being beyond the threshold.

3. The storage device of claim 1, wherein the NAND component is a page in a block.

4. The storage device of claim 3, wherein the management portion is a part of the page.

5. The storage device of claim 4, wherein the management portion of the page is programmed using a single-level cell (SLC) encoding, and wherein the user portion of the page is programmed using an encoding with a greater density than the SLC encoding.

6. The storage device of claim 1, wherein the management portion is encoded with error correction.

7. The storage device of claim 1, wherein the host uses the temperature to implement a cross-temperature read-recovery operation.

8. The storage device of claim 1, wherein the controller is arranged to modify a maintenance operation on the NAND component based on the temperature stored in the management portion.

9. The storage device of claim 8, wherein the maintenance operation is a refresh of the NAND component, and wherein the modification of the maintenance operation includes the controller adjusting thresholds to perform the refresh based on the temperature.

10. The storage device of claim 8, wherein the maintenance operation is a retirement of the NAND component.

11. The storage device of claim 10, wherein the modification of the maintenance operation includes the controller adjusting thresholds to perform the retirement based on the temperature.

12. An apparatus comprising:
an interface to a memory device that includes a memory page; and
a processing circuitry configured to:
   receive a command to write data to the memory page;
   obtain a temperature corresponding to the memory page in response to receipt of the command;
   execute the command to write data to the memory page including writing the temperature into unused bits of a dedicated error correction code (ECC) portion of the memory device that is separate from a user portion of the memory device, the dedicated ECC portion being a space that is pre-dedicated by the processing circuitry to hold ECC data, the unused bits being excess bits of the dedicated ECC portion after an ECC code is written;

read, in response to a command to read the memory page, the data from the user portion and the temperature from the dedicated ECC portion;
providing the temperature from the dedicated ECC portion as part of a response that includes the data from the user portion to a host invoking the command to read the memory page, and in response to a cross temperature event, providing a representation of the temperature as an alert as part of the response to the host of the read command; and
select a recovery operation using the temperature.

13. The apparatus of claim 12, wherein the processing circuitry is arranged to read the temperature in response to a read error metric of the data being over a threshold.

14. The apparatus of claim 12, wherein the reading of the data and the temperature includes the processing circuitry comparing the temperature to a threshold; and
wherein the selection of the recovery operation using the temperature includes the processing circuitry selecting a cross-temperature read-recovery operation in response to the temperature being beyond the threshold.

15. The apparatus of claim 14, wherein the host uses the temperature to implement the cross-temperature read-recovery operation.

16. The apparatus of claim 12, wherein the processing circuitry is arranged to modify a maintenance operation on the memory page based on the temperature stored in the dedicated ECC portion.

17. The apparatus of claim 16, wherein the maintenance operation is a refresh of the memory page, and wherein the modification of the maintenance operation includes the processing circuitry adjusting thresholds to perform the refresh based on the temperature.

18. The apparatus of claim 16, wherein the maintenance operation is a retirement of the memory page.

19. The apparatus of claim 12, wherein the dedicated ECC portion is on the memory page.

20. The apparatus of claim 12, wherein the memory page is a NAND flash device.

21. The apparatus of claim 20, wherein the dedicated ECC portion is programmed using a single-level cell (SLC) encoding, and wherein the user portion is programmed using an encoding with a greater density than the SLC encoding.

22. The apparatus of claim 21, wherein the dedicated ECC portion is encoded with an error correction.

23. The apparatus of claim 12, wherein the obtainment of the temperature includes the processing circuitry obtaining the temperature from a thermometer in response to the receipt of the command to write the data to the memory page.

24. The apparatus of claim 12, wherein the obtainment of the temperature includes the processing circuitry obtaining the temperature from a buffer, a thermometer periodically measuring the temperature and storing the temperature in the buffer.

* * * * *